United States Patent
Ozoe et al.

(10) Patent No.: US 7,420,246 B2
(45) Date of Patent: Sep. 2, 2008

(54) VERTICAL TYPE SEMICONDUCTOR DEVICE AND METHOD FOR MANUFACTURING THE SAME

(75) Inventors: Shoji Ozoe, Chita-gun (JP); Tomofusa Shiga, Nukata-gun (JP); Yoshifumi Okabe, Anjo (JP); Takaaki Aoki, Okazaki (JP); Takeshi Fukazawa, Nagoya (JP); Kimiharu Kayukawa, Nisshin (JP)

(73) Assignee: DENSO CORPORATION, Kariya (JP)

( * ) Notice: Subject to any disclaimer, the term of this patent is extended or adjusted under 35 U.S.C. 154(b) by 66 days.

(21) Appl. No.: 11/442,206

(22) Filed: May 30, 2006

(65) Prior Publication Data

US 2006/0273351 A1    Dec. 7, 2006

(30) Foreign Application Priority Data

Jun. 7, 2005  (JP) .............................. 2005-166846
Feb. 23, 2006  (JP) .............................. 2006-046514

(51) Int. Cl.
  *H01L 29/26* (2006.01)
(52) U.S. Cl. ........................ 257/330; 257/220; 257/328; 257/329; 257/334; 257/E29.08
(58) Field of Classification Search ............. 257/51, 257/330, 60, 61, E29.08, 220, 328, 329, 334
See application file for complete search history.

(56) References Cited

U.S. PATENT DOCUMENTS

| 6,927,167 B2 | 8/2005 | Fukuda et al. |
| 2004/0080015 A1* | 4/2004 | Mauder et al. ............... 257/500 |
| 2004/0171204 A1* | 9/2004 | Slater, Jr. et al. ............ 438/200 |

FOREIGN PATENT DOCUMENTS

| JP | A-10-163467 | 6/1998 |
| JP | A-2005-19830 | 1/2005 |

* cited by examiner

*Primary Examiner*—Cuong Q Nguyen
*Assistant Examiner*—Tran Q Tran
(74) *Attorney, Agent, or Firm*—Posz Law Group, PLC

(57) ABSTRACT

A vertical type semiconductor device includes: a silicon substrate having a first surface and a second surface; a first electrode disposed on the first surface of the silicon substrate; and a second electrode disposed on the second surface of the silicon substrate. Current is capable of flowing between the first electrode and the second electrode in a vertical direction of the silicon substrate. The second surface of the silicon substrate includes a re-crystallized silicon layer. The second electrode includes an aluminum film so that the aluminum film contacts the re-crystallized silicon layer with ohmic contact.

14 Claims, 3 Drawing Sheets

VERTICAL TYPE SEMICONDUCTOR DEVICE AND METHOD FOR MANUFACTURING THE SAME

CROSS REFERENCE TO RELATED APPLICATIONS

This application is based on Japanese Patent Applications No. 2005-166846 filed on Jun. 7, 2005, and No. 2006-46514 filed on Feb. 23, 2006, the disclosures of which are incorporated herein by reference.

FIELD OF THE INVENTION

The present invention relates to a vertical type semiconductor device and a method for manufacturing the same.

BACKGROUND OF THE INVENTION

A semiconductor device having a backside electrode disposed on a silicon substrate is well known. Specifically, in the device, current flows in a thickness direction perpendicular to the substrate. The device is manufactured such than, in a step of polishing a backside of the substrate, firstly, the backside of the substrate is roughly polished. Then, the backside of the substrate is finely polished with a fine grinding stone having the number #2000, which is defined in Japanese Industrial Standard. Thus, two-step polishing is performed. Thus, the silicon substrate is polished so that the thickness of the silicon substrate becomes a predetermined thickness. After that, the backside electrode is formed on the backside of the substrate.

In the above method, when the backside of the substrate is finely polished, a small dislocation and/or a small defect may be formed on the backside of the substrate so that amorphous silicon layer is formed on whole of the backside of the substrate. In this case, the backside electrode is formed on the amorphous silicon layer, so that an interface between the amorphous silicon layer and the backside electrode has a large potential barrier height. This barrier height provides a Schottky barrier. Thus, an on-state resistance of the semiconductor device becomes large.

To avoid the above problem, two methods are disclosed in, for example, U.S. Pat. No. 6,927,167 and Japanese Patent No. 3339552. In U.S. Pat. No. 6,927,167, after a step of polishing two times, a substrate is etched with etchant so that the amorphous silicon layer is removed. After this wet-etching step, a backside electrode is formed on the substrate. However, in this case, a wet-etching step is added to a manufacturing process of the device. Further, the thickness of the silicon substrate becomes thin. Furthermore, the thickness of the substrate is controlled by an etching time in the wet-etching step, so that the thickness of the substrate may be varied. Thus, it is difficult to control the thickness of the substrate accurately. Furthermore, it is not preferable for the silicon substrate to become thin when the thickness of the substrate is restricted to a predetermined thickness in view of warpage and/or durability.

In Japanese Patent No. 3339552, after a backside electrode is formed on a substrate, the substrate with the backside electrode is annealed at a temperature in a range between 400° C. and 500° C. so that metal in the backside electrode is alloyed with silicon in the substrate. An annealing step is added into the manufacturing process of the device. Further, an aluminum conductor of the device may be damaged by high temperature annealing, and a surface protection film on the device may be damaged by the high temperature annealing. Specifically, aluminum in the aluminum conductor may be diffused into the silicon substrate.

SUMMARY OF THE INVENTION

In view of the above-described problem, it is an object of the present disclosure to provide a vertical type semiconductor device. It is another object of the present disclosure to provide a method for manufacturing a vertical type semiconductor device.

A vertical type semiconductor device includes: a silicon substrate having a first surface and a second surface; a first electrode disposed on the first surface of the silicon substrate; and a second electrode disposed on the second surface of the silicon substrate. Current is capable of flowing between the first electrode and the second electrode in a vertical direction of the silicon substrate. The second surface of the silicon substrate includes a re-crystallized silicon layer. The second electrode includes an aluminum film so that the aluminum film contacts the re-crystallized silicon layer with ohmic contact.

Accordingly, the semiconductor device is provided without thinning the thickness of the silicon substrate needlessly and without performing an annealing step. Thus, the warpage of the silicon substrate is reduced, so that a failure of an electric test caused by the warpage of the substrate is avoided. Further, product defect of the device after a cutting process and the like is avoided. Furthermore, although the thickness of a substrate of a device in the prior art is controlled by an etching time in a wet-etching step, the device can be prepared without controlling the thickness of the substrate by an etching time in a wet-etching step. Thus, the thickness of the silicon substrate is easily equalized.

Further, comparing with the manufacturing method of the device having the annealing step in the prior art, since the manufacturing method of the device has no unnecessary annealing step, an aluminum conductor of the device is prevented from diffusing into the silicon substrate, and damage of a surface protection film is reduced.

A vertical type semiconductor device includes: a silicon substrate having a first surface and a second surface; a first electrode disposed on the first surface of the silicon substrate; and a second electrode disposed on the second surface of the silicon substrate. Current is capable of flowing between the first electrode and the second electrode in a vertical direction of the silicon substrate. The second surface of the silicon substrate includes a re-crystallized silicon layer. The second electrode contacts the re-crystallized silicon layer.

Accordingly, the semiconductor device is provided without thinning the thickness of the silicon substrate needlessly and without performing an annealing step. Thus, the warpage of the silicon substrate is reduced, so that a failure of an electric test caused by the warpage of the substrate is avoided. Further, product defect of the device after a cutting process and the like is avoided. Furthermore, the thickness of the silicon substrate is easily equalized. Further, since the manufacturing method of the device has no unnecessary annealing step, an aluminum conductor of the device is prevented from diffusing into the silicon substrate, and damage of a surface protection film is reduced.

A method for manufacturing a vertical type semiconductor device, which includes a silicon substrate, a first electrode and a second electrode, is provided. The first electrode is disposed on a first surface of the silicon substrate, and the second electrode is disposed on a second surface of the silicon substrate. Current is capable of flowing between the first electrode and the second electrode in a vertical direction of the silicon substrate. The method includes steps of: polishing the second surface of the silicon substrate; and forming an aluminum film or a gold film on the polished second surface of the silicon substrate by a sputtering method so that an amorphous silicon layer formed on the second surface of the silicon substrate in the step of polishing is re-crystallized. The aluminum film or the gold film contacts the re-crystallized silicon layer with ohmic contact. The second electrode includes the aluminum film or the gold film.

In the above method, the semiconductor device is provided without thinning the thickness of the silicon substrate needlessly and without performing an annealing step. Thus, the warpage of the silicon substrate is reduced, so that a failure of an electric test caused by the warpage of the substrate is avoided. Further, product defect of the device after a cutting process and the like is avoided. Furthermore, the thickness of the silicon substrate is easily equalized. Further, since the manufacturing method of the device has no unnecessary annealing step, an aluminum conductor of the device is prevented from diffusing into the silicon substrate, and damage of a surface protection film is reduced.

A method for manufacturing a vertical type semiconductor device, which includes a silicon substrate, a first electrode and a second electrode, is provided. The first electrode is disposed on a first surface of the silicon substrate, and the second electrode is disposed on a second surface of the silicon substrate. Current is capable of flowing between the first electrode and the second electrode in a vertical direction of the silicon substrate. The method includes steps of: polishing the second surface of the silicon substrate; forming an aluminum film on the polished second surface of the silicon substrate by a sputtering method so that an amorphous silicon layer formed on the second surface of the silicon substrate in the step of polishing is re-crystallized; removing the aluminum film; and forming the second electrode on a surface of the re-crystallized silicon layer after the step of removing the aluminum film.

In the above method, the semiconductor device is provided without thinning the thickness of the silicon substrate needlessly and without performing an annealing step. Thus, the warpage of the silicon substrate is reduced, so that a failure of an electric test caused by the warpage of the substrate is avoided. Further, product defect of the device after a cutting process and the like is avoided. Furthermore, the thickness of the silicon substrate is easily equalized. Further, since the manufacturing method of the device has no unnecessary annealing step, an aluminum conductor of the device is prevented from diffusing into the silicon substrate, and damage of a surface protection film is reduced.

A method for manufacturing a vertical type semiconductor device, which includes a silicon substrate, a first electrode and a second electrode, is provided. The first electrode is disposed on a first surface of the silicon substrate, and the second electrode is disposed on a second surface of the silicon substrate. Current is capable of flowing between the first electrode and the second electrode in a vertical direction of the silicon substrate. The method includes steps of: polishing the second surface of the silicon substrate; processing the polished second surface of the silicon substrate with a low temperature plasma so that an amorphous silicon layer formed on the second surface of the silicon substrate in the step of polishing is re-crystallized; and forming the second electrode on a surface of the re-crystallized silicon layer so that the second electrode contacts the re-crystallized silicon layer with ohmic contact.

In the above method, the semiconductor device is provided without thinning the thickness of the silicon substrate needlessly and without performing an annealing step. Thus, the warpage of the silicon substrate is reduced, so that a failure of an electric test caused by the warpage of the substrate is avoided. Further, product defect of the device after a cutting process and the like is avoided. Furthermore, the thickness of the silicon substrate is easily equalized. Further, since the manufacturing method of the device has no unnecessary annealing step, an aluminum conductor of the device is prevented from diffusing into the silicon substrate, and damage of a surface protection film is reduced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
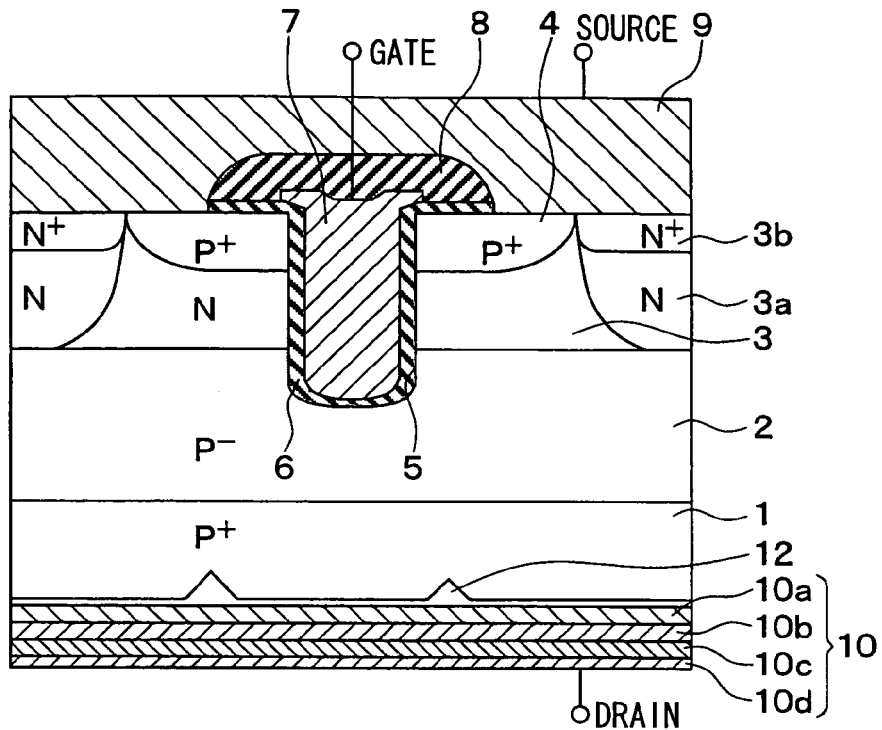
FIG. 1 is a cross sectional view showing a semiconductor device according to a first embodiment of the present invention.

A semiconductor device according to a first embodiment of the present invention is shown in FIG. 1. The device is a P conductive channel type power MOSFET having a trench gate construction. In the device, a drift layer 2 having a P$^-$ conductive type is formed on a silicon substrate 1 having a P$^+$ conductive type. A base region 3 having a N conductive type is formed on the drift layer 2. The base region 3 defines a channel region. A body layer 3a having the N conductive type is formed in the middle of the base region 3. Further, a contact region 3b having the N$^+$ conductive type is formed in a surface portion of the body layer 3a.

A source region 4 having the P+ conductive type is formed in the surface portion of the base region 3. A semiconductor substrate includes the silicon substrate 1, the drift layer 2, the base region 3 and the source region 4. The semiconductor substrate further includes a trench 5, which penetrates the source region 4 and the base region 3, and reaches the drift layer 2. A gate insulation film 6 is formed on an inner wall of the trench 5.

A gate electrode 7 is formed on the surface of the gate insulation film 6 in the trench 5. The gate electrode 7 is made of doped poly silicon. An interlayer insulation film 8 made of, for example, BPSG, is formed on the base region 3, the source region 4 and the gate electrode 7. The interlayer insulation film 8 includes a contact hole. Through the contact hole, a source electrode 9 is formed to electrically connect to the base region 3 and the source region 4. The source electrode 9 is made of aluminum. A re-crystallized silicon layer 12 is formed on the backside of the silicon substrate 1. Further, a backside electrode 10 is formed on the silicon substrate 1 through the re-crystallized silicon layer 12. The backside electrode 10 is made of metallic film having a multi-layered construction. Specifically, the backside electrode is made of Al, Ti, Ni and Au. The re-crystallized silicon layer 12 is formed in such a manner that an amorphous silicon layer 11 is re-crystallized. Here, in general, re-crystallization is defined that an amorphous layer is changed to a poly crystalline layer or a crystalline layer. Specifically, the re-crystallization is defined that a spot pattern (i.e., a dot pattern) is observed in an electron diffraction pattern.

Thus, the P conductive channel type power MOSFET having the trench gate construction is constructed. The MOSFET has a channel region of a part of the base region 3, the part disposed on a side of the trench 5. A manufacturing method of the device is described with reference to FIGS. 2A to 2C.

Figure 2A:
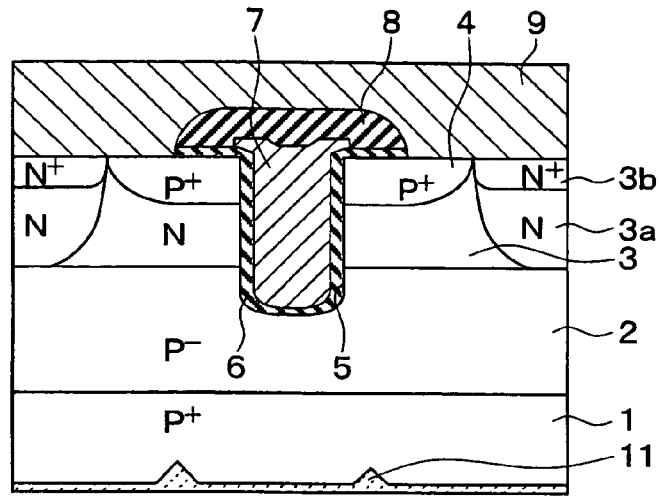
FIGS. 2A to 2C are cross sectional views explaining a method for manufacturing the device shown in FIG. 1.

As shown in FIG. 2A, firstly, the silicon substrate 1 having the P+ conductive type is prepared. The drift layer 2 having the P− conductive type is epitaxially formed on the silicon substrate 1. Then, the base region 3 having the N conductive type and the source region 4 having the P+ conductive type are formed in predetermined positions of the drift layer 2, respectively, by using an ion doping method and a thermal diffusion method.

Then, a mask layer such as a silicon oxide film is deposited by a CVD method or the like. The mask layer is etched to have a predetermined pattern by a photo lithography method and a dry-etching method. Thus, an opening is formed in the mask layer. The opening of the mask layer corresponds to the trench 5. Then, the trench 5 is formed with using the mask layer having the opening by an anisotropic dry-etching method. The trench 5 penetrates the source region 4 and the base region 3, and reaches the drift layer 2. If necessary, a sacrifice oxidation step and the like are performed. Then, the gate insulation film 6 is formed by a thermal oxidation method. The gate insulation film 6 is made of a silicon oxide film or the like.

Then, a doped silicon film as the gate electrode 7 is deposited by a LPCVD method. The doped poly silicon film is etched back so that the thickness of the doped poly silicon film becomes a predetermined thickness. Further, the doped polysilicon film is etched to be a predetermine pattern. Thus, the gate electrode 7 is formed.

With using another mask, an ion doping step and a thermal diffusion step are performed. Thus, the body layer 3a having the N conductive type and the contact region 3b having the N+ conductive type arte formed. Further, the interlayer insulation film 8 is formed by a CVD method. The contact hole is formed in the interlayer insulation film 8 by a photo lithography method and an anisotropic etching method. Then, the source electrode 9 is formed by a sputtering method.

Then, the backside of the silicon substrate 1 is polished so that the thickness of the substrate 1 becomes in a range between 200 μm and 400 μm. At this time, the amorphous silicon layer 11 is formed on the backside of the substrate 1. The thickness of the amorphous silicon layer 11 is in a range between 100 Å and 150 Å, i.e., in a range between 10 nm and 15 nm.

Figure 2B:
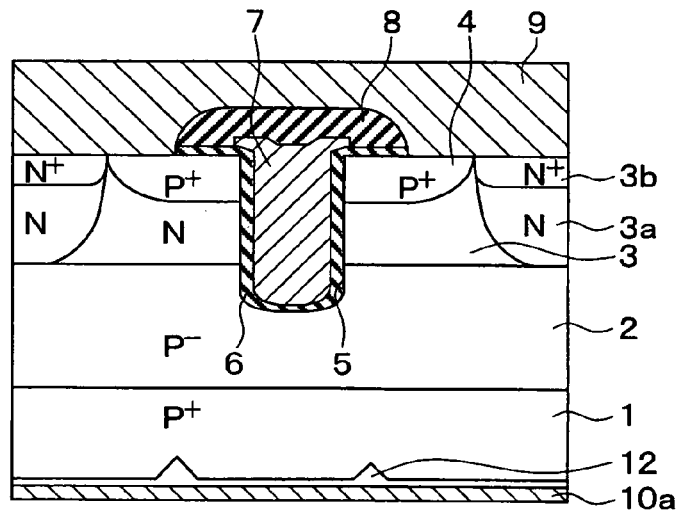

As shown in FIG. 2B, An Al film 10a is formed on the backside of the silicon substrate 1 by a sputtering method. At this time, a sputtering energy is set to be equal to or larger than 3 kW. The thickness of the Al film 10a is in a range between 750 Å and 2200 Å, i.e., in a range between 75 nm and 220 nm. Preferably, the thickness of the Al film 10a is equal to or larger than 1000 Å, i.e., 100 nm. Thus, the amorphous silicon layer 11 can be crystallized. Specifically, by forming the Al film 10a by the sputtering method, the amorphous silicon layer 11 is re-crystallized. Here, a mechanism of re-crystallization of the amorphous silicon layer 11 is not obvious. Energy of Al particle hitting on the amorphous silicon layer 11 during the sputtering process and diffusion effect of Al particle provide re-structuring of a silicon atom together with an aluminum atom. The amorphous silicon layer 11 has a fine dislocation and a fine defect so that aggregation of the silicon atoms provides the amorphous silicon state. Thus, the silicon atom in the amorphous silicon layer 11 together with the aluminum atom are re-structured and re-crystallized.

Thus, by forming the Al film 10a by the sputtering method, the backside of the silicon substrate 1 and the Al film 10a provide a Si/Al contact portion having excellent ohmic contact.

Figure 2C:
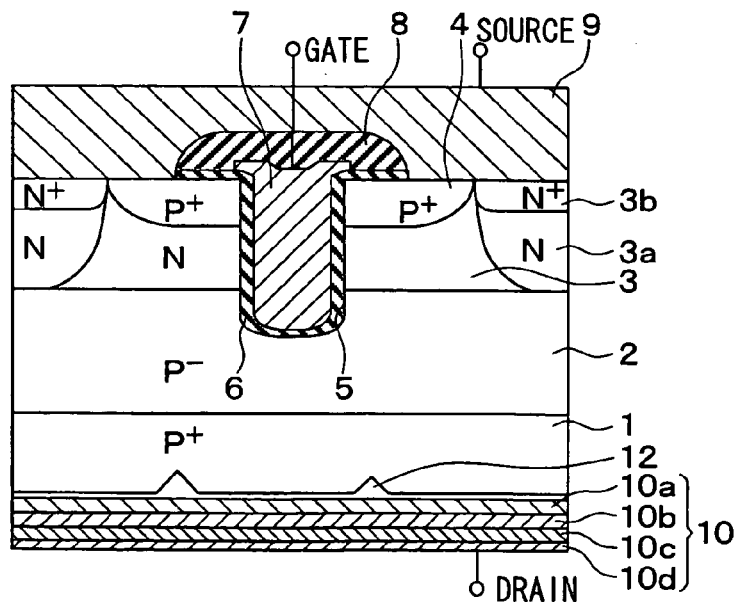

As shown in FIG. 2C, a Ti film 10b, a Ni film 10c and a Au film 10d are formed and stacked on the Al film 10a in this order. Thus, the backside electrode 10 is formed on the backside of the substrate 1. The backside electrode 10 is composed of the Al film 10a, the Ti film 10b, the Ni film 10c and the Au film 10d. Thus, the device is completed. Since the Al film 10a is electrically connected to the silicon substrate 1 with ohmic contact, the backside electrode 10 is electrically connected to the silicon substrate 1 with ohmic contact.

Accordingly, the semiconductor device is provided without thinning the thickness of the silicon substrate 1 needlessly and without performing an annealing step. Thus, the warpage of the silicon substrate 1 is reduced, so that an electric test for detecting the warpage of the substrate 1 may become unnecessary. Specifically, a failure of an electric test caused by the warpage of the substrate is avoided. Further, product defect of the device after a cutting process and the like is avoided. Furthermore, although the thickness of a substrate of a device in the prior art is controlled by an etching time in a wet-etching step, the device according to the first embodiment can be prepared without controlling the thickness of the substrate by an etching time in a wet-etching step. Thus, the thickness of the silicon substrate 1 is easily equalized.

Further, comparing with the manufacturing method of the device having the annealing step in the prior art, since the manufacturing method of the device according to the first embodiment has no unnecessary annealing step, an aluminum wiring connecting to the power MOSFET is prevented from diffusing into the silicon substrate 1, and damage of a surface protection film is reduced. Here, the diffusion of aluminum atom onto the substrate 1 is caused by high temperature in the annealing step.

Second Embodiment

Figure 3:
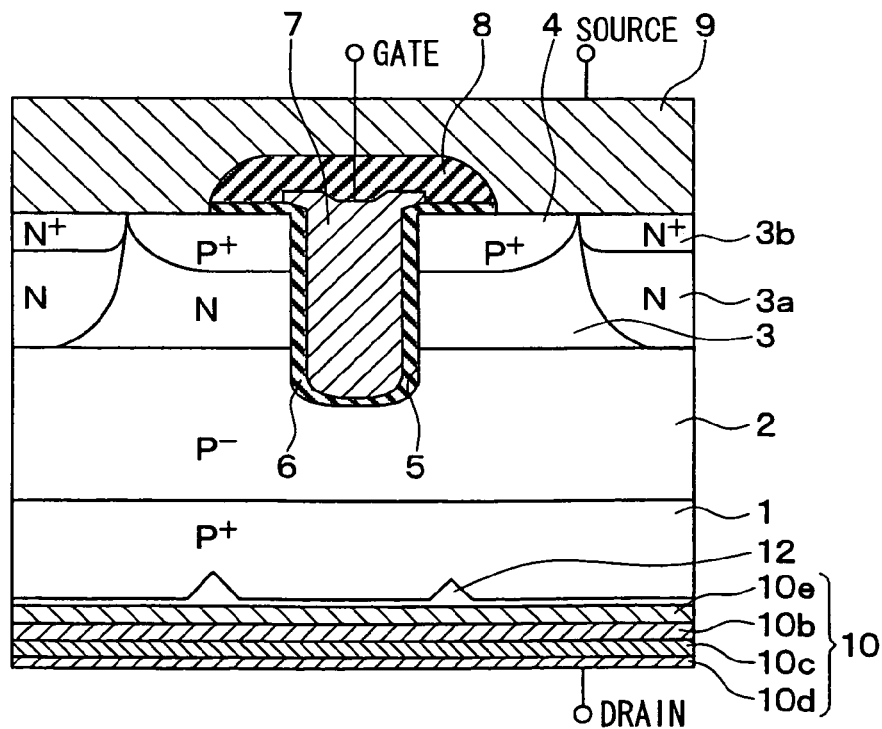
FIG. 3 is a cross sectional view showing a semiconductor device according to a second embodiment of the present invention.

Although the amorphous silicon layer 11 is re-crystallized by the sputtering method of the Al film 10a according to the first embodiment, the amorphous silicon layer 11 may be re-crystallized by the sputtering method of another metallic film such as an Au film 10e. FIG. 3 shows a semiconductor device according to a second embodiment of the present invention. The device includes the Au film 10e instead of the Al film 10a.

The device is manufactured such that the Au film 10e is formed on the backside of the silicon substrate 1 by the sputtering method, and then, the Ti film 10b, the Ni film 10c and the Au film 10d are formed in this order on the surface of the Au film 10e. In this case, the amorphous silicon layer 11 formed on the backside of the silicon substrate 1 is re-crystallized by the sputtering effect pf the Au film 10e. Specifically, in this case, the sputtering energy is controlled to be equal to or larger than 2 kW. Further, the thickness of the Au film 10e is set to be in a range between 350 Å and 650 Å, i.e., in a range between 35 nm and 65 nm.

Third Embodiment

Figure 4:
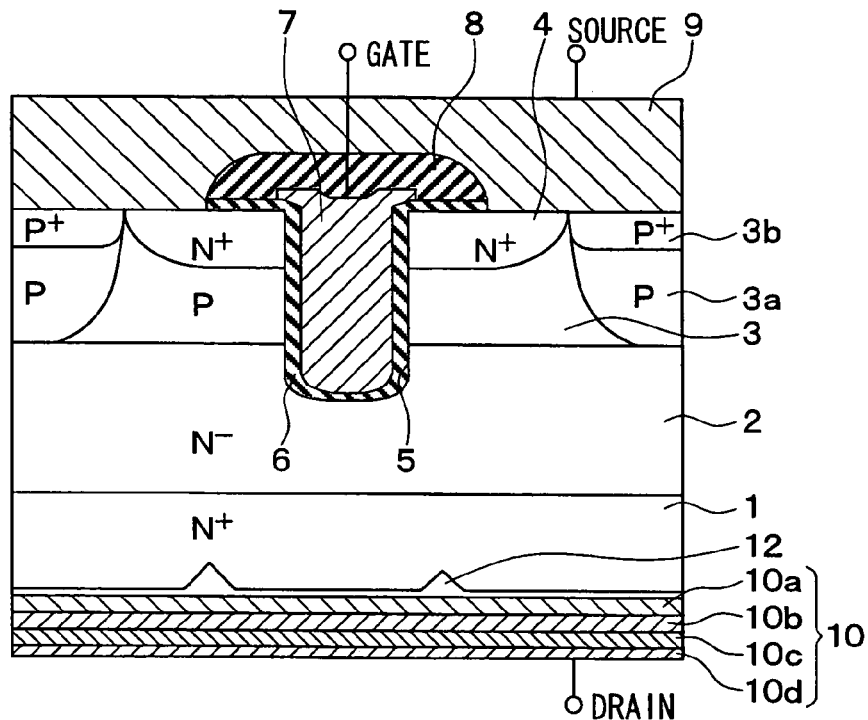
FIG. 4 is a cross sectional view showing a semiconductor device according to a third embodiment of the present invention.

Although the semiconductor device shown in FIG. 1 is the P conductive channel type power MOSFET having the trench gate construction, the semiconductor device may be another type of device. In the third embodiment, the device is a N conductive channel type power MOSFET. FIG. 4 shows the semiconductor device according to the third embodiment of the present invention. The silicon substrate 1 has the N+ conductive type, the drift layer 2 has the N− conductive type, the base region 3 has the P conductive type, the body region 3a has the P conductive type, the contact region 3b has the P+ conductive type, and the source region 4 has the N+ conductive type. Thus, each conductive type in the MOSFET shown in FIG. 3 is opposite to that in the MOSFET shown in FIG. 1.

In this case, the amorphous silicon layer 11 formed on the backside of the substrate 1 is re-crystallized by the sputtering effect of the Al film 10a. However, the Al film 10a does not have excellent ohmic contact with the silicon substrate 1 having the N conductive type. Specifically, a potential barrier height of a contact portion between the Al film 10a and the silicon substrate 1 becomes higher, so that the ohmic contact at the contact portion is not obtained. More specifically, when the concentration of the N conductive type impurity in the silicon substrate 1 is low, the potential barrier height at the contact portion becomes high, and therefore, the contact portion does not provide sufficient ohmic contact.

Accordingly, in the third embodiment, the N conductive type impurity is doped on the backside of the silicon substrate 1 by an ion implantation method or a diffusion method such as a solid phase diffusion method before the Al film 10a is formed on the backside of the substrate 1. Thus, the concentration of the N conductive type impurity on the backside of the substrate 1 becomes higher than that on the foreside of the substrate 1. Specifically, the concentration of the N conductive type impurity on the backside of the substrate 1 is set to be equal to or higher than $1 \times 10^{19}$ cm$^{-3}$. Thus, the potential barrier height of the contact portion between the silicon substrate 1 and the Al film 10a is reduced, so that the contact portion provides the ohmic contact.

Fourth Embodiment

Figure 5:
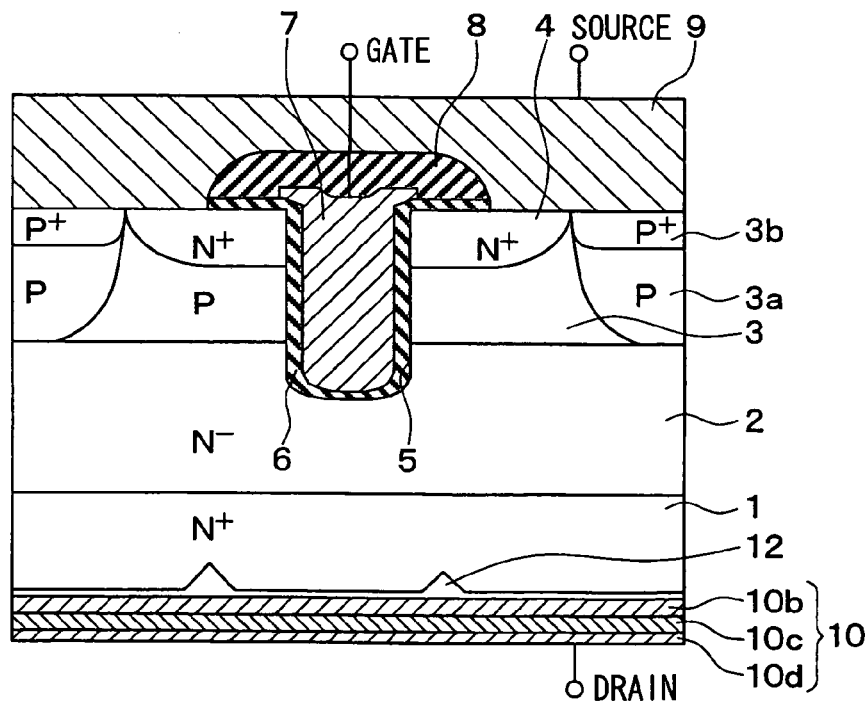
FIG. 5 is a cross sectional view showing a semiconductor device according to a fourth embodiment of the present invention.

A N conductive channel type power MOSFET according to a fourth embodiment of the present invention is shown in FIG. 5.

In the device, the Al film 10a is once formed on the backside of the substrate 1. Thus, the amorphous silicon layer 11 is re-crystallized. Then, the Al film 10a is removed from the substrate 1. After that, the Ti film 10b, the Ni film 10c and the Au film 10d are formed on the backside of the substrate 1, on which the amorphous silicon layer 11 is re-crystallized. Thus, the backside electrode 10 is composed of the Ti film 10b, the Ni film 10c and the Au film 10d. In this case, the Ti film 10b contacts the silicon substrate 1. Since the Ti film provides the ohmic contact with the N conductive type silicon substrate. Thus, the potential barrier height of the contact portion between the silicon substrate 1 and the Ti film 10b is reduced; and therefore, the Ti film 10b contacts the silicon substrate 1 with ohmic contact.

In the above method, a removing step of removing the Al film 10a is needed. An etchant for removing the Al film 10a is different from the etchant for removing the silicon substrate 1. Therefore, the thickness of the silicon substrate 1 is not thinned. Thus, the warpage of the substrate 1 is not occurred.

Fifth Embodiment

Although the amorphous silicon layer 11 is re-crystallized by the sputtering effect when the Al film is formed on the backside of the substrate 1 by the sputtering method, the amorphous silicon layer 11 may be re-crystallized by another method other than the sputtering effect.

A semiconductor device according to a fifth embodiment of the present invention has the same construction as the device shown in FIG. 5. Specifically, the Ti film 10b, the Ni film 10c and the Au film 10d are formed on the backside of the substrate 1 without using the Al film 10a.

The device according to the fifth embodiment is manufactured as follows. The device is a N conductive channel type MOSFET. The amorphous silicon layer 11 is formed when the backside of the silicon substrate 1 is polished. The amorphous silicon layer 11, i.e., the backside of the substrate 1 is processed with a low temperature plasma process. Thus, the amorphous silicon layer 11 is re-structured so that the amorphous silicon layer 11 is re-crystallized so that the re-crystallized silicon layer 12 is formed on the backside of the substrate 1. Here, the low temperature plasma process is performed at a plasma temperature equal to or lower than 200° C., which is much lower than a general plasma process having a plasma temperature in a range between 400° C. and 800° C. The lower limit of the plasma temperature in the low temperature plasma process may be any temperature as long as the plasma process is performed. For example, the lower limit of the plasma temperature may be equal to or higher than room temperature such as 25° C.

Thus, since the amorphous silicon layer 11 can be re-crystallized by the low temperature plasma process, the surface of the re-crystallized silicon layer 12 is cleaned, i.e., there is no unwanted particle disposed on the surface of the re-crystallized silicon layer 12. Accordingly, the Ti film 10b can be formed directly on the surface of the re-crystallized silicon layer 12, so that the backside electrode composed of the Ti film 10b, the Ni film 10c and the Au film 10d contacts the substrate 1 with ohmic contact. Although the Ti film 10b is formed on the re-crystallized silicon layer 12, another material film may be formed on the re-crystallized silicon layer 12, i.e., on the backside of the substrate 1.

MODIFICATIONS

Although the semiconductor device is the power MOSFET, the semiconductor device may be another semiconductor device such as a vertical IGBT, a power transistor and a diode. The semiconductor device may be a vertical type device, in which current flows in a vertical direction of the substrate.

Here, when the device is the IGBT, each conductive type in the silicon substrate 1 is reversed. Accordingly, in FIGS. 1-3, the silicon substrate 1 has the N conductive type in the IGBT. In this case, the backside electrode 10 is formed by the same method as the device shown in FIG. 4 or 5 so that the backside electrode 10 contacts the silicon substrate 1 having the N conductive type with ohmic contact.

In the devices shown in FIGS. 1, 2, 4 and 5, the Al film 10a is formed on the backside of the substrate 1. The Al film 10a may be made of pure aluminum. Alternatively, the Al film 10a may be made of Al—Si alloy or Al including Si.

Although the amorphous silicon layer 11 is re-crystallized, a part of the amorphous silicon layer 11 may be re-crystallized so that the other part of the amorphous silicon layer 11 is not re-crystallized. In this case, the other part of the amorphous silicon layer 11 may remain on the backside of the substrate 1. However, the contact portion between the backside electrode 10 and the substrate 1 provides the ophmic contact.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A vertical type semiconductor device comprising:
   a silicon substrate having a first surface and a second surface;
   a first electrode disposed on the first surface of the silicon substrate; and
   a second electrode disposed on the second surface of the silicon substrate, wherein
   current is capable of flowing between the first electrode and the second electrode in a vertical direction of the silicon substrate,
   the second surface of the silicon substrate includes a re-crystallized silicon layer, and
   the second electrode includes an aluminum film so that the aluminum film contacts the re-crystallized silicon layer with ohmic contact.

2. The device according to claim 1, wherein
   the silicon substrate has a P conductive type, and
   the re-crystallized silicon layer has the P conductive type.

3. The device according to claim 1, wherein
   the silicon substrate has a N conductive type,
   the re-crystallized silicon layer has the N conductive type, and
   the re-crystallized silicon layer has an impurity concentration of the N conductive type, which is higher than an impurity concentration of a first surface side of the silicon substrate.

4. The device according to claim 1, further comprising:
   a drift layer disposed on the first surface of the silicon substrate and having a first conductive type;
   a base region disposed on the drift layer and having a second conductive type;
   a source region disposed in a surface portion of the base region and having the first conductive type;
   a trench penetrating the source region and the base region and reaching the drift layer;
   a gate insulation film disposed on an inner wall of the trench;
   a gate electrode disposed on the gate insulation film in the trench; and
   an interlayer insulation film having a contact hole and covering the gate electrode, wherein
   the contact hole of the interlayer insulation film couples with the source region and the base region,
   the first electrode is disposed on the interlayer insulation film, and electrically coupled with the source region and the base region through the contact hole, and
   the vertical type semiconductor device is a vertical type transistor.

5. A vertical type semiconductor device comprising:
   a silicon substrate having a first surface and a second surface;
   a first electrode disposed on the first surface of the silicon substrate; and
   a second electrode disposed on the second surface of the silicon substrate, wherein
   current is capable of flowing between the first electrode and the second electrode in a vertical direction of the silicon substrate,
   the second surface of the silicon substrate includes a re-crystallized silicon layer, and
   the second electrode contacts the re-crystallized silicon layer.

6. The device according to claim 5, wherein
   the re-crystallized silicon layer has a N conductive type,
   the second electrode includes a Ti film so that the Ti film contacts the re-crystallized silicon layer with ohmic contact.

7. The device according to claim 5, wherein
   the second electrode includes a Au film so that the Au film contacts the re-crystallized silicon layer with ohmic contact.

8. The device according to claim 5, further comprising:
   a drift layer disposed on the first surface of the silicon substrate and having a first conductive type;
   a base region disposed on the drift layer and having a second conductive type;
   a source region disposed in a surface portion of the base region and having the first conductive type;
   a trench penetrating the source region and the base region and reaching the drift layer;
   a gate insulation film disposed on an inner wall of the trench;
   a gate electrode disposed on the gate insulation film in the trench; and
   an interlayer insulation film having a contact hole and covering the gate electrode, wherein
   the contact hole of the interlayer insulation film couples with the source region and the base region,
   the first electrode is disposed on the interlayer insulation film, and electrically coupled with the source region and the base region through the contact hole, and
   the vertical type semiconductor device is a vertical type transistor.

9. The device according to claim 1, wherein the re-crystallized silicon layer comprises a poly crystalline or crystalline layer resulting from change of an amorphous silicon layer previously disposed on the second surface of the substrate.

10. The device according to claim 1, wherein the re-crystallized silicon layer is defined by a spot pattern observed in an electron diffraction pattern.

11. The device according to claim 1, wherein the second electrode has a multi-layered construction including the aluminum film contacting the re-crystallized silicon layer, titanium, nickel and gold.

12. The device according to claim 5, wherein the re-crystallized silicon layer comprises a poly crystalline or crystalline layer resulting from change of an amorphous silicon layer previously disposed on the second surface of the substrate.

13. The device according to claim 5, wherein the re-crystallized silicon layer is defined by a spot pattern observed in an electron diffraction pattern.

14. The device according to claim 5, wherein the second electrode has a multi-layered construction including titanium film contacting the re-crystallized silicon layer, nickel film and gold film.

* * * * *